(12) United States Patent
Ina et al.

(10) Patent No.: US 6,906,805 B1
(45) Date of Patent: Jun. 14, 2005

(54) POSITION DETECTING SYSTEM AND EXPOSURE APPARATUS USING THE SAME

(75) Inventors: Hideki Ina, Yokohama (JP); Minoru Yoshii, Tokyo (JP); Masanobu Hasegawa, Utsunomiya (JP); Takashi Satoh, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/428,490

(22) Filed: Oct. 28, 1999

(30) Foreign Application Priority Data

Oct. 30, 1998 (JP) .......................................... 10-325933

(51) Int. Cl.$^7$ ................................................ G01B 9/02
(52) U.S. Cl. ..................................... 356/497; 356/511
(58) Field of Search ............................... 356/487, 489, 356/492, 493, 495, 497, 498, 508, 511, 512, 513, 509, 561

(56) References Cited

U.S. PATENT DOCUMENTS

| | | | |
|---|---|---|---|
| 4,869,593 A | | 9/1989 | Biegen ........................ 356/351 |
| 5,349,440 A | * | 9/1994 | DeGroot ..................... 356/489 |
| 5,402,234 A | * | 3/1995 | Deck .......................... 356/497 |
| 5,416,587 A | * | 5/1995 | Riccobono et al. ......... 356/497 |
| 5,438,413 A | | 8/1995 | Mazor et al. ............... 356/363 |
| 5,523,843 A | * | 6/1996 | Yamane et al. ............. 356/500 |
| 5,694,217 A | * | 12/1997 | Hizuka ........................ 356/491 |
| 5,783,342 A | | 7/1998 | Yamashita et al. ............ 430/30 |
| 5,808,724 A | * | 9/1998 | Ina et al. ....................... 355/53 |
| 5,907,404 A | * | 5/1999 | Marron et al. .............. 356/489 |
| 5,991,034 A | * | 11/1999 | Ohtsuka ..................... 356/511 |
| 6,028,670 A | * | 2/2000 | Deck .......................... 356/497 |
| 6,185,315 B1 | * | 2/2001 | Schmucker et al. ........ 356/450 |

FOREIGN PATENT DOCUMENTS

WO     WO 97/40422     10/1997

OTHER PUBLICATIONS

Hiroshi Kubota, "Wave Optics", Iwanami Shoten Co., pp. 414–415.

"Needs and Seeds of Optical Measurement", edited by Shadan–Hojin Keiryo Kanri Kyokai and Hikari Oyou Keisoku Gijutu Chosa Kenkyu linkai, Corona Co., pp. 228–229.

"New Optical Microscopes", vol. 1, "Theory and Practice of Laser Microscopes", supervised by Tetsuya Fujita, edited by Minoru Kawada, Gakusai–Kikaku Co., pp. 82–83.

* cited by examiner

*Primary Examiner*—Samuel A. Turner
*Assistant Examiner*—Michael A. Lyons
(74) *Attorney, Agent, or Firm*—Fitzpatrick, Cella, Harper & Scinto (57) ABSTRACT

A position detecting system includes a light source device for providing coherent light, an incoherence-transforming device for transforming the coherent light from the light source device, into incoherent light, an optical system for dividing the incoherent light from the incoherence-transforming device into divided light, wherein one of the divided light beams produces an intermediate image, and light from the intermediate image is directed to illuminate a target upon a surface of an object while another of divided light beams is directed to be reflected by a surface which is optically conjugate with the intermediate image, and wherein light from the target and light reflected by the conjugate surface are re-combined, an image pickup device for producing an imagewise signal corresponding to the target on the basis of the light re-combined by the optical system, wherein positional information related to a position of the target with respect to a direction along the surface of the object can be produced on the basis of the imagewise signal, and an image contrast adjusting device for adjusting image contrast of an image of a portion close to the target, as picked up by the image pickup device.

11 Claims, 8 Drawing Sheets

POSITION DETECTING SYSTEM AND EXPOSURE APPARATUS USING THE SAME

FIELD OF THE INVENTION AND RELATED ART

This invention relates to a position detecting system and an exposure apparatus using the same. The present invention is particularly suitably usable in a step-and-repeat type or step-and-scan type exposure apparatus (projection exposure apparatus), for example, for the manufacture of various devices such as a semiconductor device (e.g., an IC or LSI), and an image pickup device (e.g., a CCD), or a display device such as a liquid crystal panel, for example. More specifically, when a fine electronic circuit pattern formed on the surface of a first object such as a reticle is to be transferred by exposure or printed by projection through a projection optical system, to a second object such as a wafer in such an exposure apparatus, the invention may be used in detecting positional relation related to a mark provided on the wafer, on the basis of optical interference.

Projection exposure apparatuses for semiconductor manufacture should have a good performance for projecting and transferring a circuit pattern of a reticle upon the surface of a wafer at a high resolving power. The resolution for the circuit pattern projection may be improved by enlarging the numerical aperture (NA) of a projection optical system while holding the wavelength of exposure light fixed. Alternatively, it may be improved by using a shorter wavelength of light, for example, using i-line in place of g-line or using short wavelength light such as a wavelength of 248 nm or 193 nm as can be emitted from an excimer laser, for example, or light of synchrotron orbital radiation (SOR).

On the other hand, because of further miniaturization of a circuit pattern, it is required to align a reticle, having such an electronic circuit pattern, and a wafer, very precisely.

The required precision may be one-third or less of a circuit pattern. For a 1 giga-bit DRAM, for example, of a circuit pattern is based on a 0.18 micron rule, an overlay precision (alignment through the whole exposure region) of 60 nm or smaller may be required.

Furthermore, an overlay inspection system for measuring the overlay precision should have precision of about 1/10 of the overlay precision. Thus, for a 1 giga-bit DRAM, a precision of 6 nm or smaller may be required.

As an attempt to accomplish high-precision position measurement, there has been proposed a TIS (Tool Induced Shift) correction method effective to reduce the influence of a TIS, which is a detection system based error factor among various measurement error factors.

Figure 1A:
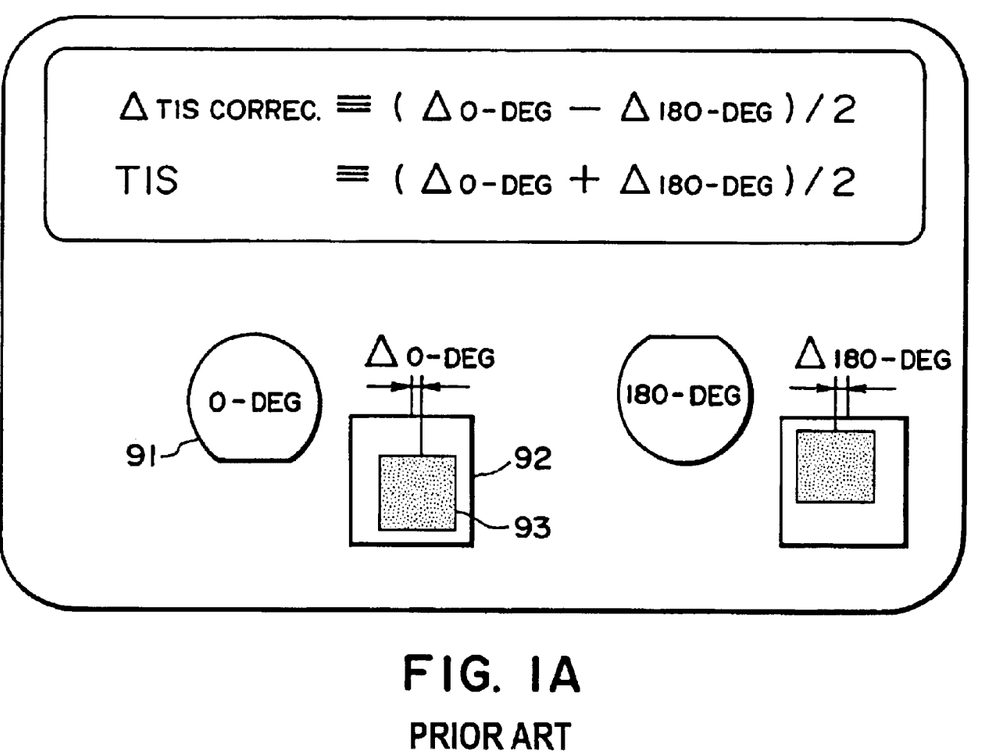
FIG. 1A is a schematic view for explaining a TIS correction method.

FIG. 1A illustrates the TIS correction. In this case, as an example of a position detecting pattern, a surface step (level difference) is defined on a silicon wafer 91 through an etching process, whereby a pattern 92 is produced. After completion of an alignment operation, the relative positional relationship between this pattern 92 and a resist image pattern 93, having been printed and developed, is measured. The measurement is made twice, in the TIS correction method. Here, the second time measurement is performed by rotating the wafer 91 by 180 degrees as compared with the first time measurement. For this reason, the first time measured value is called a zero-degree measured value $\Delta_{0\text{-}deg}$, while the second time measured value is called a 180-degree measured value $\Delta_{180\text{-}deg}$.

In accordance with the TIS correction method, a value obtainable by subtracting 180-degree measured value $\Delta_{180\text{-}deg}$ from a zero-degree measured value $\Delta_{0\text{-}deg}$ and then by dividing the difference by two, is used as a measured value ΔTIS correction. Here, a value which is obtainable by adding the zero-degree measured value $\Delta_{0\text{-}deg}$ and the 180-degree measured value $\Delta_{180\text{-}deg}$ and then by dividing the sum by two, is called a TIS.

Figure 1B:
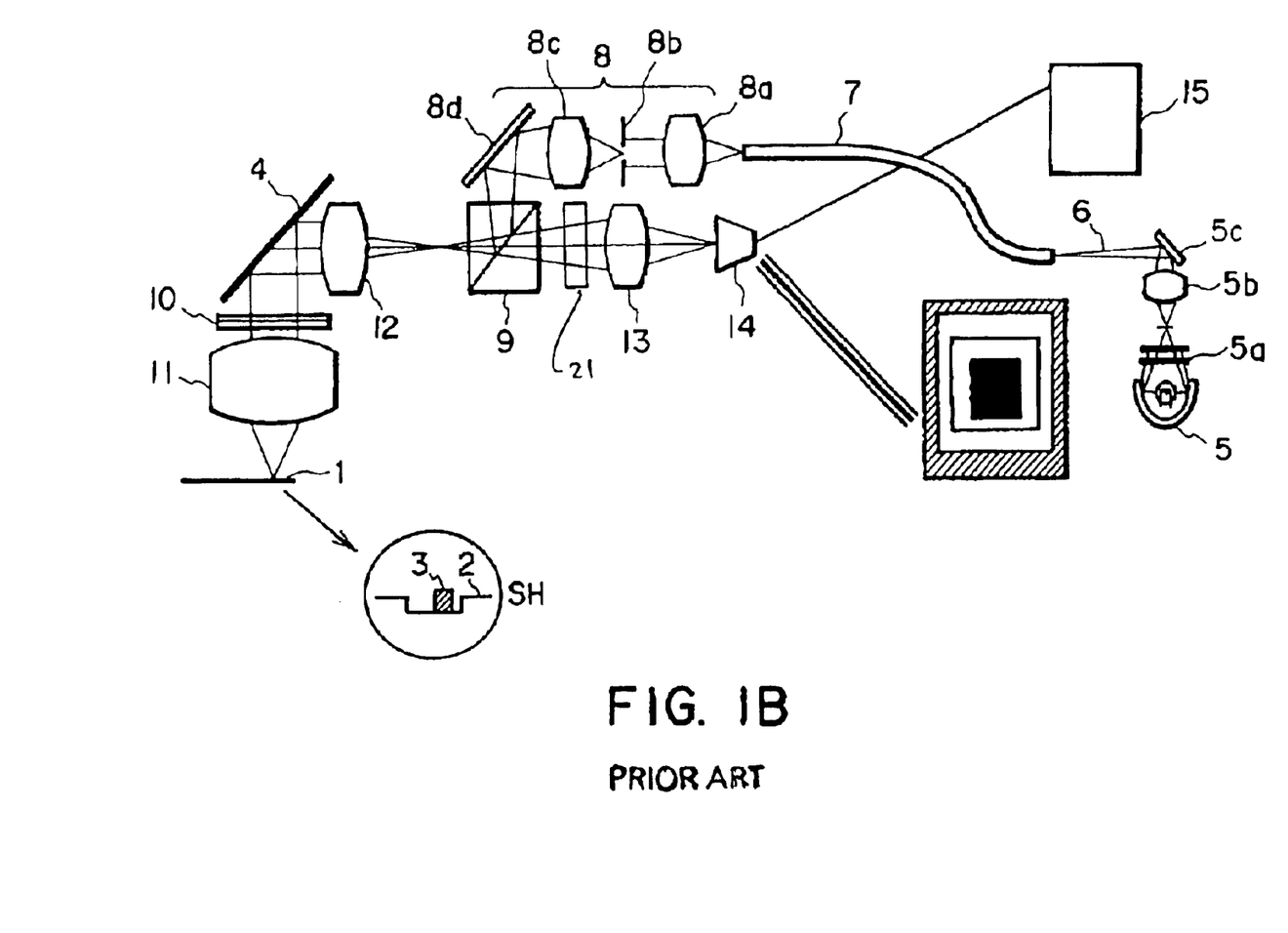
FIG. 1B is a schematic view of an optical arrangement of a registration inspecting system of a known type.

Most of currently used registration inspecting systems and alignment detecting systems are based on a bright-field image processing method. FIG. 1B is a schematic view of a main portion of a registration inspecting system position detecting system) of a known type. In this example, a special mark is provided on a wafer. The position detection is performed by producing, through an optical system, an image of that mark on an image pickup device such as a CCD, for example, and by making various signal processing to an electrical signal resulting from that image.

More specifically, a mark 2 is produced on a wafer 1 through an etching process, for example. Also, mark 3 is formed upon that mark 2 through a lithographic process. The registration inspecting system operates to measure the relative positional relation between these marks 2 and 3. A light beam 6 emitted from a halogen lamp 5 is directed through an optical filter 5a and a lens 5b and via a mirror 5c to a fiber 7. The light from the fiber 7 is directed through an illumination system 8, and a polarization beam splitter 9 reflects S-polarized light. The light goes via a relay 12, a mirror 4, a quarter waveplate 10 and an objective lens 11, and it illuminates the two marks 2 and 3 on the wafer 1. The illumination system comprises a lens 8a for collecting light rays from the fiber 7, a stop 8b, a lens 8c for collecting light from the stop 8b, and a mirror 8d.

Reflected light form the two marks 2 and 3 goes back along the path of illumination, and it goes via the objective lens 11, the quarter waveplate 10, the mirror 4 and the relay 12. Since the polarization direction is P-polarized, at this time, the light passes through the polarization beam splitter 9. The light goes via a quarter waveplate 21, and it is directed through an erector 13 to the image pickup surface of a CCD camera 14, whereby images of the two marks 2 and 3 are formed thereon. The images of the two marks 2 and 3 are transformed by the CCD camera 14 into electrical signals which are then applied to a computer (computing means) 15. The signals are processed and analyzed by the computer 15, whereby the relative positional relationship between the two marks 2 and 3 is detected.

The imaging performance most required in this optical system is the symmetry of image (mark image). If there is anything that deteriorates the image symmetry in the optical system, a TIS is there.

In this type of detecting system, the magnification is made high such as 100×, for example, and, in most cases, a region close to the optical axis is used. Thus, the main factors which cause deterioration of the image symmetry are not abaxial aberrations but, rather, they are eccentric coma aberration close to the optical axis of an optical system as well as non-uniformness of an illumination system.

In order to meet further increases in the integration density of a semiconductor device, a three-dimensional arrangement of the device structure has been attempted in addition to further miniaturization of the circuit pattern. If the numerical aperture of a projection optical is enlarged for attaining a higher integration density of a semiconductor device, the depth of focus of the projection optical system is shortened. For this reason, it is very important to polish the surface of a semiconductor device to remove any surface level differences or surface irregularities to improve the flatness, to ensure that a photoresist is applied to a flattened surface to thereby accomplish higher resolution of projection exposure.

Also, polishing an insulative film layer to be provided on a silicon substrate, to assure a uniform thickness film layer thereon is an important factor for making uniform a capacity dispersion among different layers or regulating the "Through Hole" depth.

A chemical mechanical polishing (CMP) method is an example of a flattening method for assuring flatness by removing any surface level differences or surface irregularities of a semiconductor device. This flattening method, however, involves a serious problem in regard to a mark to be used for the detection, since the surface level difference of that mark is also removed by the flattening operation. Therefore, in the dark-field image processing, which is used most frequently and with a good precision, for example, the contrast of a mark image used in the measurement becomes very low, causing degradation of the detection precision.

There is a phase difference detecting method, as another example. Since, however, a phase plate should be inserted into an optical system, in this method, it may cause a TIS described hereinbefore. While the contrast may increase, the precision is difficult to achieve. Particularly, in order that the system may be used in combination with an ordinary bright-field system, a phase plate has to be demountably mounted into the optical system. This is a large factor for the production of TIS.

SUMMARY OF THE INVENTION

It is accordingly an object of the present invention to provide a position detecting system by which, like a phase difference detecting method, a higher contrast is assured while a TIS causal factor is held small, and by which a position detecting mark can be detected stably and with a good precision even in a process of a low surface-level difference such as a CMP process, for example, such that a pattern of a reticle can be transferred to a wafer with a good precision.

It is another object of the present invention to provide an exposure apparatus having such a position detecting system.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 2:
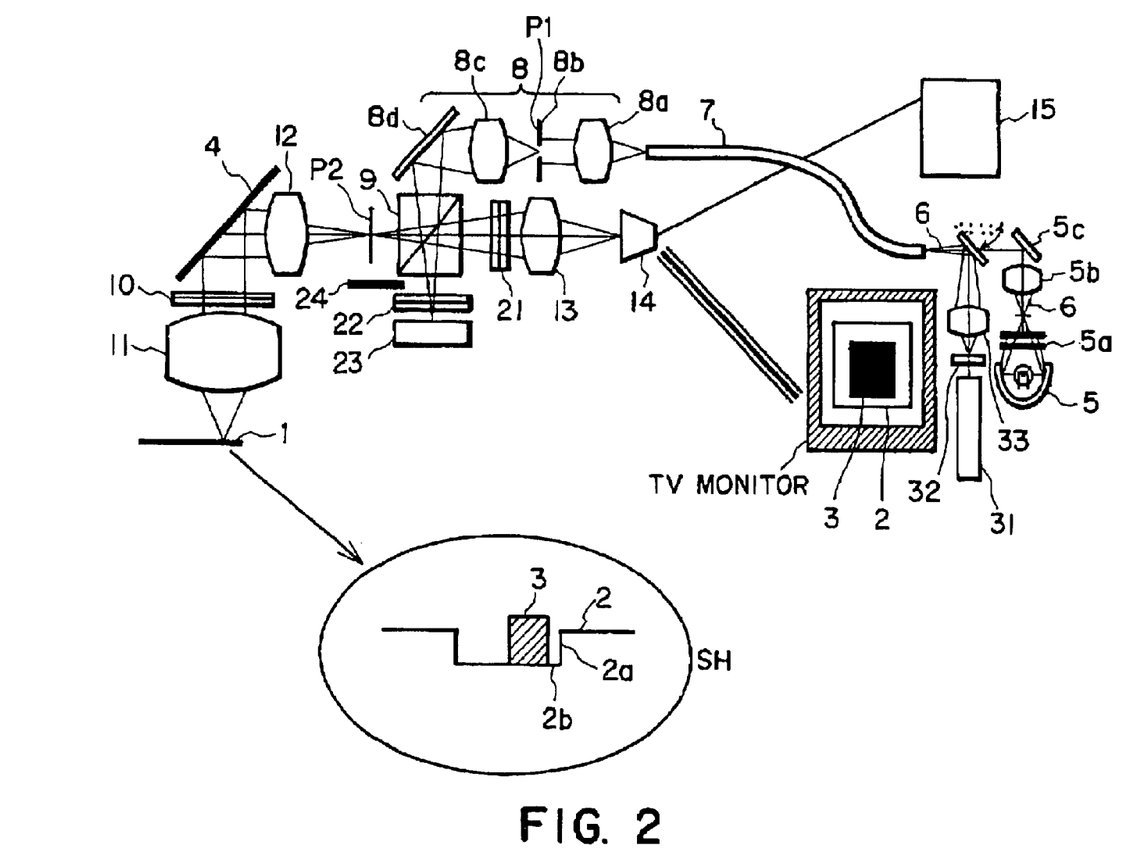
FIG. 2 is a schematic view of a position detecting system according to a first embodiment of the present invention.

FIG. 2 is a schematic view of a main portion of a first embodiment of the present invention. In this embodiment, the invention is applied to a registration inspecting system which is incorporated into a step-and-repeat type or step-and-scan type projection exposure apparatus for use in the manufacture of semiconductor devices or any other microdevices. While the following description will be made of an example of inspection of registration between two marks, the system may be used as an alignment detecting system for detecting a position of an alignment mark or as a wafer alignment system.

The position detecting system illustrated is arranged so that two alignment marks 2 and 3, each being formed on a wafer 1 with a three-dimensional shape, are illuminated with non-sensitizing light (non-exposure light) such as light from a He—Ne laser (light source) 31, for example, having a wavelength of 633 nm with which a photoresist applied to the wafer 1 is not sensitized, wherein the light from the light source is projected through various components to be described later.

Light from these marks 2 and 3 is directed through various components (to be described later) and to a CCD camera 14, such that the positional information on the alignment marks 2 and 3 is observed through the CCD camera 14, on the basis of which the positions of the marks are detected.

On the other hand, in this embodiment, a reticle (first object: not shown in the drawing) having a circuit pattern formed thereon is illuminated with light (exposure light) from a light source which is a component of an illumination system (not shown) of a projection exposure apparatus, such as, for example, light of g-line or i-line from an ultra-high pressure Hg lamp or exposure light of an emission wavelength from an excimer laser. The projection optical system (not shown) serves to project the circuit pattern of the reticle onto the surface of a wafer (second object) 1 with a reduction magnification of 1:5 or 1:10, for example.

The wafer 1 is placed on a wafer chuck, not shown. The wafer chuck is mounted on a θ-Z stage (driving means: not shown), and it serves to attract the wafer 1 onto its chucking surface so that the position of the wafer 1 does not shift against any vibrations. The θ-Z stage is mounted on a tilt stage (not shown), and it serves to move the wafer 1 in a focus direction (a direction of an optical axis of the optical system), upwardly and downwardly.

In the position detecting system shown in FIG. 2, an etching pattern mark (mark) 2 is formed on a silicon etching wafer (wafer) 1 through a lithographic process, a development process and an etching process, for example. On the thus provided etching pattern mark 2, a resist pattern mark (mark) 3 is formed through a lithographic process and a development process. In the system shown in this drawing, the relative positional relation between these two marks 2 and 3 is measured.

In the measuring system of this embodiment, a mark provided on a wafer is imaged upon a photoelectric converting element through an optical system, and the position of the wafer is measured on the basis of a corresponding video signal. Here, coherent light is used as a light source, and a rotary diffusion plate is disposed between the light source and a fiber to transform the light into incoherent light. The mark on the wafer is illuminated with the incoherent light. A portion of the illumination light is reflected at a plane which is optically conjugate with the mark on the wafer, and it is re-combined with the reflection light from the mark on the wafer. These lights as re-combined are imaged upon the photoelectric converging element to form an image thereon. As an image to be practically used in the measurement, an image which is obtainable by subtracting, from an image at a focus with which the difference in reflection factor between the outside and the inside of the mark on the wafer becomes largest, an image at a focus with which the difference in reflection factor becomes similarly largest but the sign is opposite, is used. For a change in surface level difference (step height) on the wafer, such a light source with which the contrast becomes largest is used, in the detection system.

Next, the registration inspecting method (mark position detecting method) in this embodiment will be described. This may be applied to detection of an alignment mark position in an ordinary alignment process.

Denoted at 31 is a light source (light source means) which comprises a He—Ne laser, for example, and which emits coherent light. Denoted at 32 is a rotary diffusion plate which serves to transform the laser light from the light source 31, into incoherent light. The rotary diffusion plate 32 functions to move the speckle formed on the wafer 1 to thereby average the same, in a time period during which a mark image is picked up by a CCD camera 14, to be described later.

Denoted at 33 is a condenser lens for collecting light (incoherent light) from the rotary diffusion plate 32. The light is then reflected by a mirror 6, and it enters a fiber 7. The light emitted from the fiber 7 is collected within an illumination system 8, wherein S-polarized light is reflected by a polarization beam splitter 9 and is then imaged at a point $P_2$. Thereafter, the light goes via a relay optical system 12, a mirror 4, a quarter waveplate 10 and an objective lens (projecting optical system) 11, in this order, and it illuminates two marks 2 and 3 formed on the wafer 1 surface. The illumination system 8 comprises a lens 8a, a stop 8b, a condenser lens 8c and a mirror 8d. The stop 8b and the point $P_2$ are placed optically conjugate with each other.

The reflection light from the marks 2 and 3 on the wafer 1 goes back along its on-coming path, via the objective lens 11, the quarter waveplate 10, the mirror 4 and the relay optical system 12, in this order. It is then imaged at the point $P_2$ and, thereafter, it enters the polarization beam splitter 9. Since the light impinging on the polarization beam splitter 9 is P-polarized light, it passes through the beam splitter 9. Thereafter, it passes through a quarter waveplate 21 and an erector 13 by which it is directed to an image pickup surface of a CCD camera 14. By this, images (mark images) of the two marks 2 and 3 are formed on the image pickup surface.

Next, a reference light for producing an interference image on the basis of the image of the marks 2 and 3 upon the image pickup surface of the CCD camera 14, will be explained.

The P-polarized light passed through the polarization beam splitter, which is of the light from the light source 31 and passed through the illumination system 8, is transformed by a quarter waveplate 22 into circularly polarized light, which is then reflected by a mirror 23. Here, the position of the mirror 23 is placed on a plane which is optically conjugate with the wafer 1 to be observed. The reflected light goes again through the quarter waveplate 22 by which it is transformed into S-polarized light and enters the polarization beam splitter 9. The light which is S-polarized light is reflected by the polarization beam splitter 9. Thereafter, it passes through the quarter waveplate 21 and the erector 13, by which it is projected on the image pickup surface of the CCD camera 14, as a reference light. Thus, upon the image pickup surface of the CCD camera 14, the reference light is superposed on the reflection image from the mark 2 or 3 of the wafer 1, whereby an interference image is produced thereon.

The images of the two marks 2 and 3 are photoelectrically converted by the CCD camera 14 into corresponding signals, which are applied to a computer (computing means) 15. The signals are processed by the computer 15, whereby the relative positional relationship between the marks 2 and 3 is detected.

In the present embodiment, an interference image related to the marks 2 and 3 is produced in the manner described above. Thus, in this embodiment, an image of higher contrast than an image obtainable with ordinary bright-field illumination, can be produced. Further, in this embodiment, a difference between interference images corresponding to two focuses may be taken, by which an image of twice the contrast can be produced.

Figure 3A:
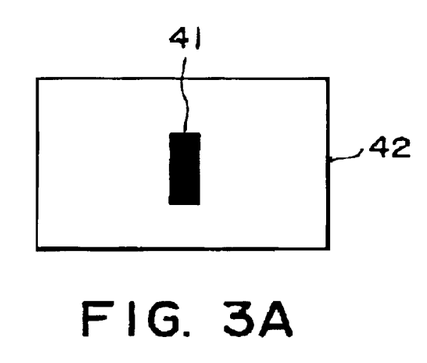
FIG. 3A is a schematic view for explaining an example of focus under a condition of an interference image that the outside of a mark is bright.
Figure 3B:
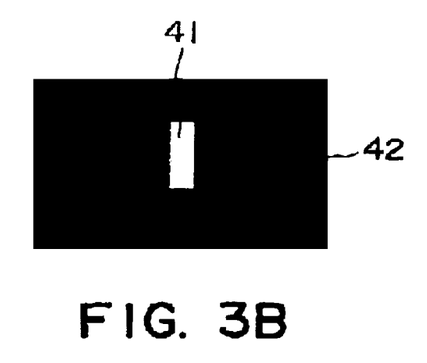
FIG. 3B is a schematic view for explaining an example of focus under a condition of an interference image that the outside of a mark is dark.
Figure 4:
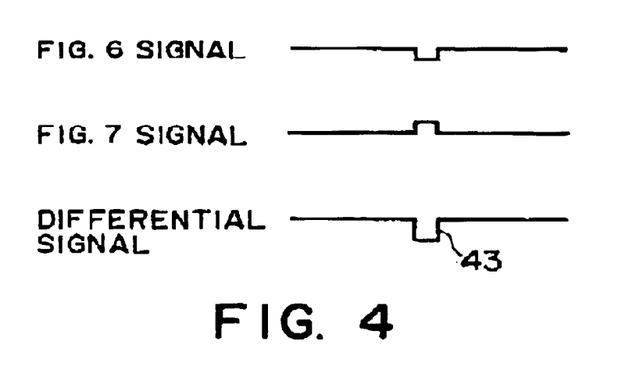
FIG. 4 is a schematic view for explaining signals corresponding to the conditions of interference images that the outside of the mark is bright and that the outside of the mark is dark, as well as a signal corresponding to the difference between these signals.

More specifically, these two focuses may be set as those focus positions where, as shown in FIGS. 3A, 3B and 4, the difference between an output of the CCD camera 14 corresponding to an alignment mark 41 (which corresponds to the top face 2a of the mark 2 of FIG. 2) and an output of the CCD camera corresponding to a mark 42 outside the mark 41 (which mark 42 corresponds to the bottom face 2b of the mark 2 of FIG. 2), that is, the difference in image intensities of them, becomes largest and also where their signs are opposite to each other. The positions can be determined on the basis of the intensity of reflection light from the mark 41 or 42 as the wafer 1 is moved along the optical axis direction of the optical system.

As an example, it is now assumed that the surface level difference of the alignment mark 41 is equal to $\lambda/4$, which corresponds to $\frac{1}{4}$ of the illumination wavelength $\lambda$ (633 nm when a He—Ne laser is used). Then, the intensity of the interference image of the mark 42 outside the mark 41 becomes highest as the focus is changed and set to a bright interference condition wherein the optical path difference between the reference light and the mark 42 outside the mark 41 is equal to a product of the illumination wavelength $\lambda$ by an integer. regards the alignment mark 41, on the other hand, since the surface level difference is $\lambda/4$, the intensity becomes lowest, to the contrary (that is, if the reflection intensity of the reference light is equal to the reflection intensity from the wafer, the visibility of the interference fringe becomes higher, and the intensity disappears completely). As a result, a pattern (first image) such as shown in FIG. 3A is produced.

Second, if the focus is changed by $\lambda/4$ from the initial focus, as shown in FIG. 3B, the optical path difference between the reference light and the mark 42 outside the mark 41 then becomes equal to a product of the illumination wavelength $\lambda$ plus $\lambda/4$, corresponding to a dark interference condition. As a result, the intensity of the interference image of the mark 42 outside the mark 41 becomes lowest. On the other hand, as regards the alignment mark 41, since the surface level difference is λ/4, the intensity becomes highest, to the contrary. As a result, a pattern (second image) such as shown in FIG. 3B is produced.

By taking a difference between these two images, an image 43 (FIG. 4) having a contrast two times higher than an interference image corresponding to a single focus, can be produced. In a case in which bright-field illumination, which does not need reference light, is desired, a shutter 24 (FIG. 2) may be inserted or, alternatively, the quarter waveplate 22 and the mirror 23 may be omitted.

The structure and function of the present invention will now be explained in detail, in comparison with interference microscope systems shown in FIGS. 5 and 6.

Figure 5:
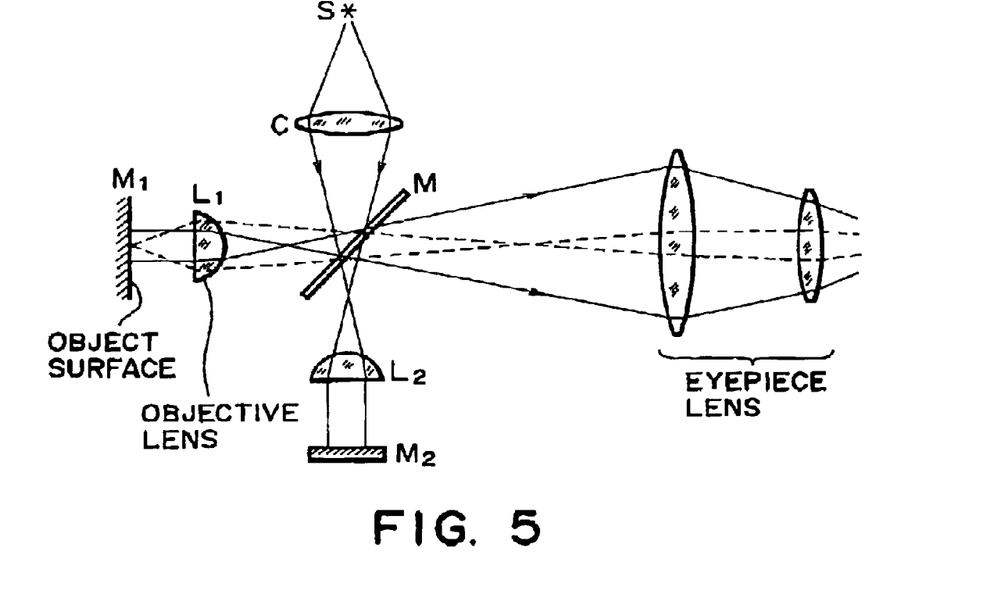
FIG. 5 is a schematic view for explaining the principle of a Linnik interference microscope system.
Figure 6:
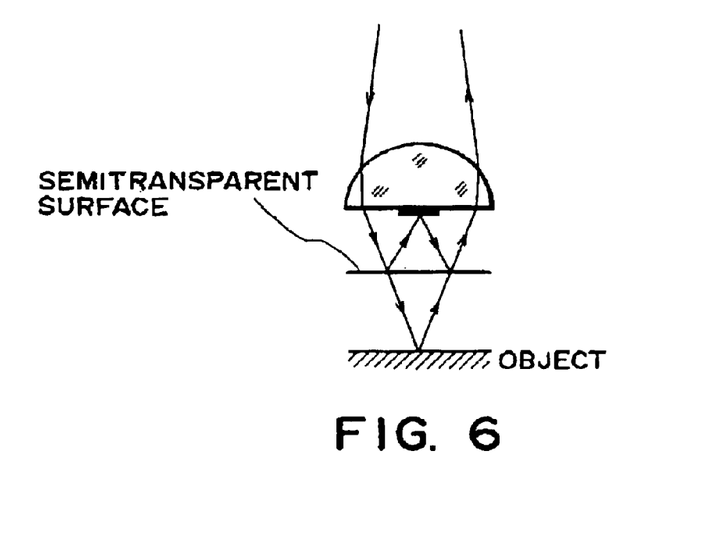
FIG. 6 is a schematic view for explaining the principle of a Mirau interference microscope system.

FIG. 5 shows a Linnik interference microscope system wherein one the same as the objective is used as reference light to thereby cancel any abaxial aberrations in design. On the other hand, FIG. 6 shows a Mirau interference microscope system wherein a half mirror disposed between an objective and an article to be observed, such that light reflected by the half mirror is used as reference light. As regards details of these interference microscope systems, reference may be made to "Wave Optics", Hiroshi Kubota, Iwanami Shuppan Co., pages 414 and 415.

In the Linnik interference microscope shown in FIG. 5, an objective lens L2 the same as an objective lens L1 is used as a reference light. In the present invention, as compared therewith, one the same as an objective is not used. To the contrary, an intermediate image is produced at the mirror 23, and reflection light therefrom is used as reference light. If there is any TIS described above, such as spherical aberration or coma aberration, in an optical system between an objective and a relay, which are not a common optical system, an interference image produced is shifted by one color such that a sharp interference image is not obtainable.

In the present invention, on the other hand, since it is a requisition to remove a TIS, as described, in a bright-field system, a clear or sharp interference image can be produced even when a reference light from an intermediate image is used.

As regards the relationship between the incoherence-transformation and the interference image, it has been confirmed by experiments that an interference fringe obtainable at the CCD camera 14 can be observed without speckle. This is because an interference fringe is produced by interference between surfaces (mirror 23 and wafer 1), which are optically conjugate with each other, that an interference fringe is produced under an interference condition established with optical path lengths between points upon the optically conjugate surfaces, and that the averaging is accomplished by moving the speckle relative to the fringe through the rotary diffusion plate 32.

Figure 7:
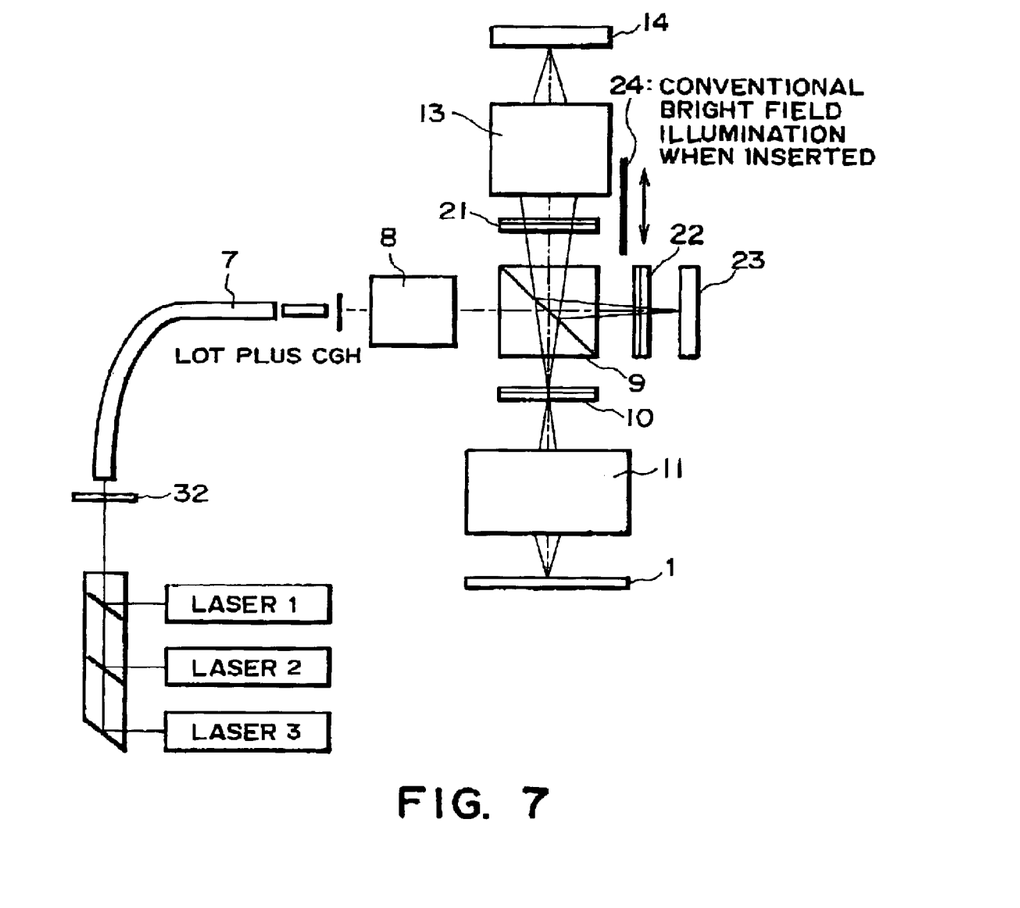
FIG. 7 is a schematic view of a position detecting system according to a second embodiment of the present invention.

FIG. 7 is a schematic view of a main portion of a second embodiment of the present invention. In FIG. 7, like numerals as those of FIG. 2 are assigned to corresponding elements.

In this embodiment, there are three lasers having different emission wavelengths. As illustrated, the system comprises a rotary diffusion plate 32, a fiber 7, an illumination system 8, a polarization beam splitter 9, a quarter waveplate 10, a first objective 11, a second objective 13, a CCD camera 14, a quarter waveplate 21, another quarter waveplate 22, a mirror 23, and a shutter 24.

In this embodiment, even if the surface level difference of a mark 2 or 3 to be detected is changed, an appropriate laser may be selected to assure production of a signal of high contrast. If, for example, the surface level difference of the mark 2 or 3 is equal to a product of the illumination wavelength by an integer plus a half wavelength, the interference image is under the same interference condition as that of the alignment mark 3 or the mark 2 outside the mark 3. Thus, the signal contrast is very low.

As a numerical example, it is assumed that the wavelength of the illumination light is 633 nm, and the surface level difference is 950 nm, which corresponds to one and a half of the wavelength. This is just the condition described above. If, for example, a laser having an emission wavelength of 785 nm is used as illumination light, the level difference of 950 nm now corresponds to 1.21 λ(950=785+165=785+ 0.21×785), such that an interference image of a high contrast can be produced.

The number of lasers to be prepared is not limited to three, as in the FIG. 7 example. Only two lasers will provide a sufficient result. However, in consideration of the complexity in semiconductor processes, as many light source as possible may preferably be used. Thus, three lasers are used in this example.

While the present invention has been described with reference to examples in which a low image contrast for a small surface level difference in a bright-field detection system is increased significantly, the invention is not limited to it. For example, the invention can be applied to measurement of a mark with a three-dimensional shape, with similar advantageous results.

As shown in FIG. 2, both a He—Ne laser 31 and a halogen lamp 5 may be prepared as light source means, which may be used interchangeably. When the He—Ne. laser 31 is used as a light source, measurement of a three-dimensional shape can be performed on the basis of images at four focuses (images obtainable while changing the focus amount successively, each by a unit of λ/4), that is, measurement can be done in accordance with what is called a fringe scan method.

If, on the other hand, the halogen lamp 5 is used, there occurs white interference and thus, the coherence length becomes short. Therefore, measurement of a three-dimensional shape is performed on the basis of what is called a coherence probe method.

As regards details of the fringe scan method for measurement of a three-dimensional shape, reference may be made to "Needs and Seeds of Optical Measurement", Corona Co., page 228. Also, as regards to details of the coherence probe method, reference may be made to "Theory and Practice of Laser Microscopes", page 82, Volume 1, of "New Optical Microscopes", Gakusai-Kikaku Co.

Next, an embodiment of a semiconductor device manufacturing method which uses a position detecting system such as described above, will be explained.

Figure 8:
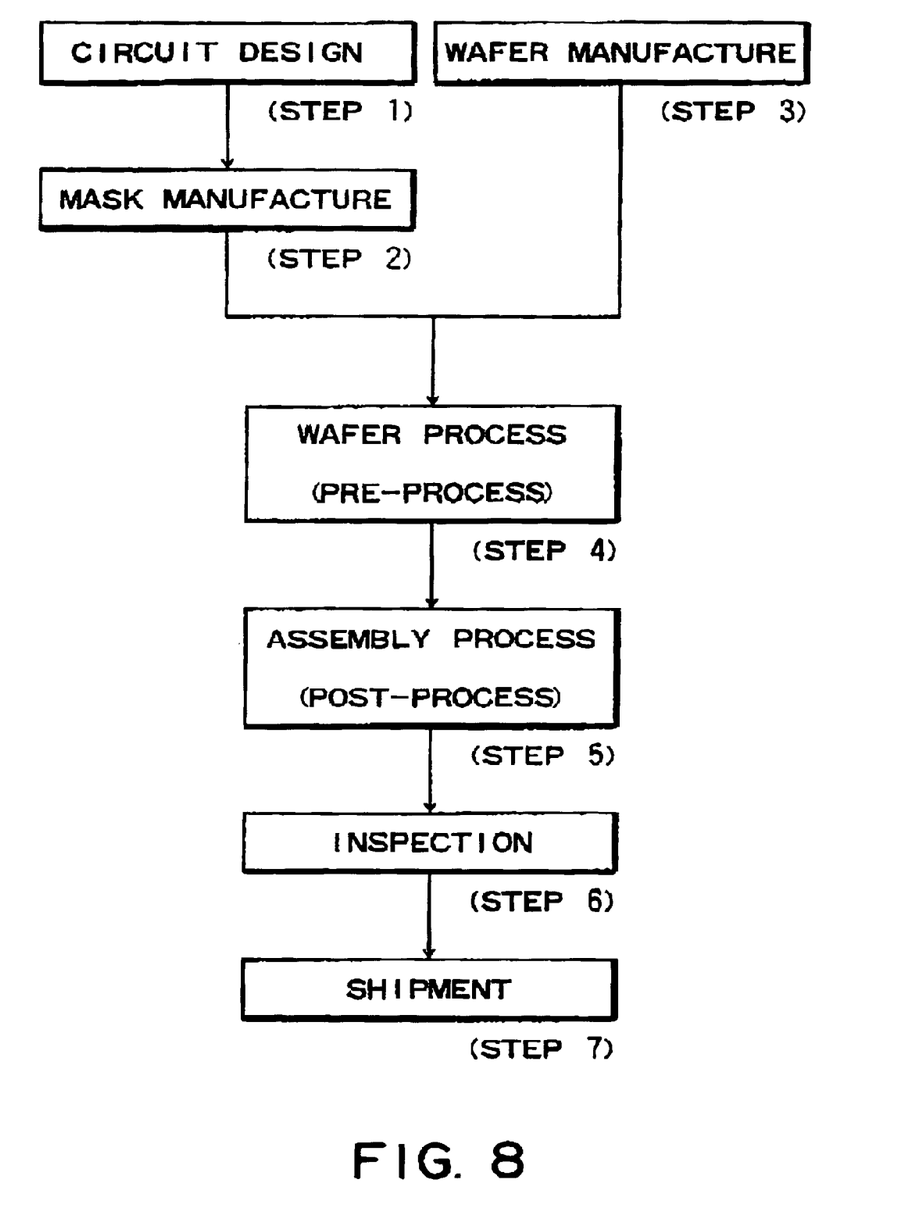
FIG. 8 is a flow chart of device manufacturing processes, in an embodiment of the present invention.

FIG. 8 is a flow chart of a procedure for the manufacture of microdevices such as semiconductor chips (e.g., ICs or LSIs), liquid crystal panels or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a preprocess) wherein, by using the so prepared mask and wafer, circuits are practically formed on the wafer through lithography. Step 5 subsequent to this is an assembling step (called a postprocess) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 9:
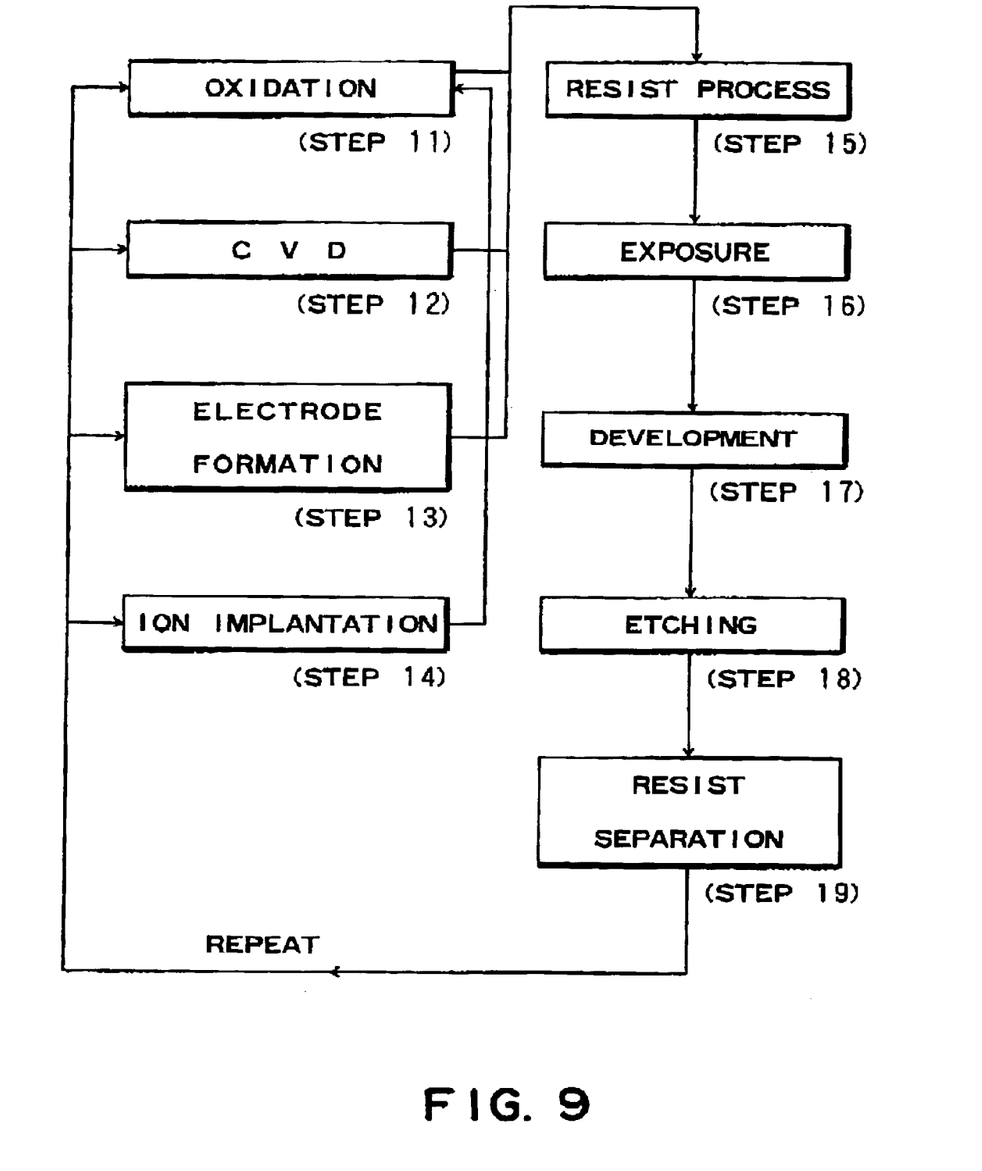
FIG. 9 is a flow chart for explaining details of a wafer process in the procedure of FIG. 8.

FIG. 9 is a flow chart showing details of the wafer process.

Step 11 is an oxidation process for oxidizing the surface of a wafer. Step 12 is a CVD process for forming an insulating film on the wafer surface. Step 13 is an electrode forming processing for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through an exposure apparatus such as described above. The exposure process is performed after a wafer alignment process based on detection of the position of an alignment mark or marks, through a position detecting system described hereinbefore.

Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the embodiments of the present invention as described hereinbefore, as with a phase difference detecting system, the contrast can be improved while a TIS causal factor is suppressed low, and thus, a mark for position detection can be detected stably and with a good precision even in a process of a small surface level difference such as a CMP process. Therefore, the invention can provide a position detecting system and/or an exposure apparatus having the same, with which a pattern of a reticle can be transferred onto the surface of a wafer very accurately and precisely.

Further, in accordance with the present invention, an interference microscope system can be used with bright-field illumination, by which a high contrast can be assured for a mark of a small surface level difference such as in a CMP process. Thus, high precision position detection can be accomplished.

While the invention has been described with reference to the structures disclosed herein, it is not confined to the details set forth and this application is intended to cover such modifications or changes as may come within the purposes of the improvements or the scope of the following claims.

What is claimed is:

1. A position detecting system comprising:
    a light source;
    a beam splitter for dividing light from said light source into plural light beams, wherein one of the divided light beams produces an intermediate image of a predetermined position in a path of the light before the light is divided;
    a reflecting member disposed at a position where another of the divided light beams directly produces an image of the predetermined position;
    an optical system for illuminating a target with light from the intermediate image, wherein the target is disposed at a position which is optically conjugate with the predetermined position; and
    an image pickup, wherein light from the target and light reflected by a reflecting surface of said reflecting member are re-combined to produce an image interference signal upon said image pickup.

2. A position detecting system corresponding to claim 1, wherein said target and said image pickup are optically conjugate with each other.

3. A position detecting system according to claim 1, wherein said light source provides coherent light.

4. A position detecting system according to claim 3, further comprising a light diffuser movably disposed along a light path within said position detecting system.

5. A position detecting system according to claim 1, wherein said beam splitter is a polarization beam splitter.

6. A position detecting system according to claim 1, wherein the target and the intermediate image are optically conjugate with each other.

7. A position detecting system according to claim 1, wherein said light source includes a plurality of light sources providing different wavelengths.

8. A position detecting system according to claim 1, wherein the target comprises a mark provided on an object and having a surface with a surface level difference with respect to a direction of an optical axis of said optical system, and said image pickup is operable to detect an image signal related to the mark, at a position, as the object is moved along the optical axis direction, corresponding to a peak value at which a difference in reflection factor between a top and a bottom of the surface level difference of the mark is large.

9. A position detecting system comprising:
    a light source;
    a beam splitter for dividing light from said light source into plural light beams, wherein one of the divided light beams is directed to illuminate a target while another of the light beams is directed to a reflecting member, the target and the reflecting member both being optically conjugate with a common position in a path of the light before the light is divided; and
    an image pickup, wherein light from the target and light reflected by the reflecting member are re-combined to produce an image interference signal upon said image pickup,
    wherein said position detecting system includes a lens in the path of the light beam between said beam splitter and the target, whereas said position detecting system does not include any lens in the path of the light between said beam splitter and said reflecting member.

10. An exposure apparatus comprising:
    position detecting means for detecting a position of an alignment mark provided on a surface of a workpiece to be exposed, said position detecting means including (i) a light source, (ii) a beam splitter for dividing light from said light source into plural light beams, wherein one of the divided light beams produces an intermediate image of a predetermined position in a path of the light before the light is divided, (iii) a reflecting member disposed at a position where another of the divided light beams directly produces an image of the predetermined position, (iv) an optical system for illuminating a target with light from the intermediate image, wherein the target is disposed at a position which is optically conjugate with the predetermined position, and (v) an image pickup, wherein light from the target and light reflected by a reflecting surface of said reflecting member are re-combined to produce an image interference signal upon said image pickup; and exposure means for aligning the workpiece by use of positional information related to a position of the alignment mark with respect to a direction along the surface of the workpiece and produced on the basis of the image signal, and for performing a pattern exposure to the workpiece.

11. A device manufacturing method comprising:

a position detecting step for detecting a position of an alignment mark provided on a surface of a workpiece to be exposed, by use of a position detecting system that includes (i) a light source, (ii) a beam splitter for dividing light from the light source into plural light beams, wherein one of the divided light beams produces an intermediate image of a predetermined position in a path of the light before the light is divided, (iii) a reflecting member disposed at a position where another of the divided light beams directly produces an image of the predetermined position (iv) an optical system for illuminating a target with light from the intermediate image, wherein the target is disposed at a position which is optically conjugate with the predetermined position, and (v) an image pickup, wherein light from the target and light reflected by a reflecting surface of the reflecting member are re-combined to produce an image interference signal upon the image pickup;

a pattern exposure step for aligning the workpiece by use of positional information related to a position of the alignment mark with respect to a direction along the surface of the workpiece and produced on the basis of the image signal, and for performing a pattern exposure to the workpiece; and a development step for developing the workpiece having been exposed in said pattern exposure step, whereby a device can be produced from the developed workpiece.

* * * * *

UNITED STATES PATENT AND TRADEMARK OFFICE
CERTIFICATE OF CORRECTION

PATENT NO. : 6,906,805 B1
DATED : June 14, 2005
INVENTOR(S) : Hideki Ina et al.

It is certified that error appears in the above-identified patent and that said Letters Patent is hereby corrected as shown below:

Title page,
Item [56], References Cited, OTHER PUBLICATIONS, "Needs and Seeds...," reference, "linkai" should read -- Iinkai --.

Column 2,
Line 55, "aberration" should read -- aberrations --.

Column 6,
Line 54, "integer. regards the alignment mark 41, on the other hand," should read -- integer. --.
Line 55, insert a new paragraph beginning with -- As regards the alignment mark 41, on the other hand, --.

Column 8,
Line 14, "1.21 λ(950" should read -- 1.21λ (950 --.
Line 20, "source" should read -- sources --.

Signed and Sealed this

Fourth Day of October, 2005

JON W. DUDAS
*Director of the United States Patent and Trademark Office*